US012772584B2

(12) United States Patent

Kuroda et al.

(10) Patent No.: US 12,772,584 B2

(45) Date of Patent: Oct. 20, 2026

(54) SOLID-STATE IMAGING DEVICE PACKAGE MANUFACTURING METHOD AND SOLID-STATE IMAGING DEVICE PACKAGE

(71) Applicant: KANEKA CORPORATION, Osaka (JP)

(72) Inventors: Kenta Kuroda, Osaka (JP); Daiki Kinoshita, Osaka (JP); Makoto Kutsumizu, Osaka (JP)

(73) Assignee: KANEKA CORPORATION, Osaka (JP)

( * ) Notice: Subject to any disclaimer, the term of this patent is extended or adjusted under 35 U.S.C. 154(b) by 419 days.

(21) Appl. No.: 18/463,193

(22) Filed: Sep. 7, 2023

(65) Prior Publication Data

US 2024/0088180 A1 Mar. 14, 2024

(30) Foreign Application Priority Data

Sep. 9, 2022 (JP) ................................ 2022-143762

(51) Int. Cl.
*H10F 39/00* (2025.01)

(52) U.S. Cl.
CPC ......... *H10F 39/804* (2025.01); *H10F 39/026* (2025.01)

(58) Field of Classification Search
CPC ..... H10F 39/804; H10F 39/026; H10F 39/011
See application file for complete search history.

(56) References Cited

U.S. PATENT DOCUMENTS

| | | | | |
|---|---|---|---|---|
| 10,101,651 | B1 * | 10/2018 | Wei | G03F 1/62 |
| 2003/0094665 | A1 * | 5/2003 | Harazono | H10F 77/50 257/E31.127 |
| 2004/0189213 | A1 * | 9/2004 | Okazaki | H10K 59/1275 313/461 |
| 2006/0046038 | A1 * | 3/2006 | Nakanishi | B32B 27/308 428/212 |
| 2006/0202610 | A1 * | 9/2006 | Karasawa | H10K 59/8792 313/498 |

(Continued)

FOREIGN PATENT DOCUMENTS

| | | | | |
|---|---|---|---|---|
| JP | 2004296453 A | | 10/2004 | |
| JP | 2019034487 A | * | 3/2019 | |
| WO | WO-2023013727 A1 | * | 2/2023 | H10F 39/12 |

*Primary Examiner* — Mohsen Ahmadi

(74) *Attorney, Agent, or Firm* — Alleman Hall LLP

(57) ABSTRACT

A solid-state imaging device package comprises a solid-state imaging device including a functional portion that performs imaging at the center portion of a surface, a frame provided to surround the functional portion at the outer peripheral portion of the solid-state imaging device, and a transparent substrate that is opposite to the functional portion and fixed to the frame to cover the solid-state imaging device. A manufacturing method includes the steps of forming the frame by laminating a resin in multiple layers by a 3D printer on either one of the solid-state imaging device or the transparent substrate, and bonding one other of the solid-state imaging device or the transparent substrate to the frame. The step of forming the frame further includes laminating the resin so that a surface roughness Ra of an inner peripheral surface of the frame is 50 nm or more and 30 μm or less.

7 Claims, 3 Drawing Sheets

(56) References Cited

U.S. PATENT DOCUMENTS

| | | | | |
|---|---|---|---|---|
| 2007/0267712 | A1* | 11/2007 | Fujita | H10F 39/804<br>257/E31.093 |
| 2008/0277752 | A1* | 11/2008 | Fujita | H10F 39/804<br>257/E31.118 |
| 2012/0068182 | A1* | 3/2012 | Yamanaka | H10D 30/674<br>257/E33.053 |
| 2015/0212350 | A1* | 7/2015 | Niiyama | B32B 37/0076<br>349/122 |
| 2018/0215842 | A1* | 8/2018 | Katou | C08F 2/44 |
| 2019/0335119 | A1* | 10/2019 | Shimizu | H10F 39/804 |
| 2020/0254681 | A1* | 8/2020 | Hakkaku | B33Y 10/00 |
| 2021/0057607 | A1* | 2/2021 | Lin | H10H 20/01 |
| 2021/0343771 | A1* | 11/2021 | Iida | H10F 39/811 |
| 2023/0094289 | A1* | 3/2023 | Rak | H05K 3/284<br>174/250 |
| 2024/0206322 | A1* | 6/2024 | Kinoshita | H10K 85/654 |

* cited by examiner

SOLID-STATE IMAGING DEVICE PACKAGE MANUFACTURING METHOD AND SOLID-STATE IMAGING DEVICE PACKAGE

BACKGROUND OF THE INVENTION

Field of the Invention

The present invention relates to a solid-state imaging device package manufacturing method and a solid-state imaging device package.

Related Art

A solid-state imaging device package has been widely used in which a frame surrounding the solid-state imaging device is bonded to a substrate on which the solid-state imaging device is mounted and an opening of the frame is covered with a glass plate (for example, see Japanese Unexamined Patent Application, Publication No. 2004-296453). In such a solid-state imaging device package, the frame determines the relative position of the glass plate with respect to the solid-state imaging device, and suppresses unintended light from entering the solid-state imaging device, thereby reducing noise of a photographed image such as a flare or a ghost.

Patent Document 1: Japanese Unexamined Patent Application, Publication No. 2004-296453

SUMMARY OF THE INVENTION

Demands for reduction in size and high definition of solid-state imaging device packages are increasing day by day. Therefore, it is an object of the present invention to provide a solid-state imaging device package with less noise in a photographed image and a manufacturing method thereof.

A solid-state imaging device package manufacturing method according to an aspect of the present invention is directed to a method of manufacturing the solid-state imaging device package including a solid-state imaging device including a functional portion that performs imaging and a margin portion that surrounds the functional portion, a frame provided on the margin portion, and a transparent substrate that is opposite to the functional portion and fixed to the frame to cover the functional portion. The manufacturing method includes the steps of forming the frame by laminating a resin in multiple layers by a three-dimensional (3D) printer on either one of the solid-state imaging device or the transparent substrate, and bonding one other of the solid-state imaging device or the transparent substrate to the frame, in which the step of forming the frame further includes laminating the resin so that a surface roughness Ra of an inner peripheral surface of the frame is 50 nm or more and 30 μm or less.

In the above-described solid-state imaging device package manufacturing method, the 3D printer may be an optical modeling 3D printer, and a height of a single layer may be set to 0.1 μm or more and 10 μm or less.

In the above-described solid-state imaging device package manufacturing method, an inner peripheral edge of a pattern of the resin to be laminated corresponding to the inner peripheral surface of the frame may be formed into a wave shape, and the resin may be laminated to shift a phase of the wave shape for each layer.

In the above-described solid-state imaging device package manufacturing method, a pitch of the wave shape may be 50 nm or more and 30 μm or less, and a wave height of the wave shape may be 50 nm or more and 30 μm or less.

In the above-described solid-state imaging device package manufacturing method, the 3D printer may be an ink jet 3D printer that ejects a droplet of the resin having a volume of 0.05 pL or more and 3.0 pL or less.

A solid-state imaging device package according to an aspect of the present invention includes a solid-state imaging device including a functional portion that performs imaging and a margin portion that surrounds the functional portion, a frame provided on the margin portion, and a transparent substrate that is opposite to the functional portion and fixed to the frame to cover the functional portion, in which a surface roughness Ra of an inner peripheral surface of the frame is 50 nm or more and 30 μm or less.

In the above-described solid-state imaging device package, the frame may have, on the inner peripheral surface, a plurality of wave shapes formed by repeating irregularities in a direction parallel to the solid-state imaging device and the transparent substrate, and by shifting a phase of each of the plurality of wave shapes in a direction perpendicular to the solid-state imaging device and the transparent substrate.

According to the present invention, it is possible to provide a solid-state imaging device package with less noise in a photographed image and a manufacturing method thereof.

DETAILED DESCRIPTION OF THE INVENTION

Figure 1:
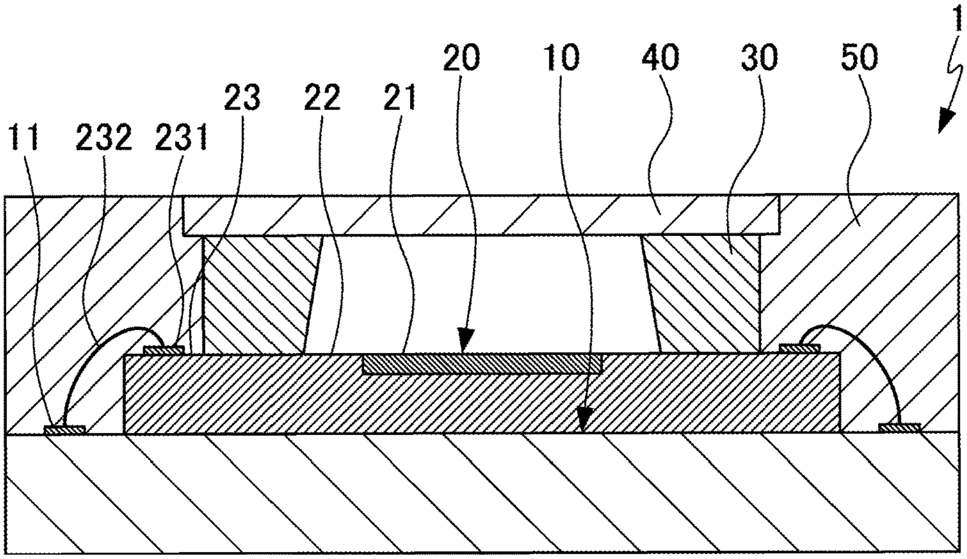
FIG. 1 is a cross-sectional view of a solid-state imaging device package according to an embodiment of the present invention.

Hereinafter, embodiments of the present invention will be described with reference to the accompanying drawings. FIG. 1 is a cross-sectional view of a solid-state imaging device package 1 according to a first embodiment of the present invention. The solid-state imaging device package 1 is a so-called GoC (Glass on Chip) type solid-state imaging device.

The solid-state imaging device package 1 includes a mounting substrate 10, a solid-state imaging device 20 mounted on the mounting substrate 10, a frame 30 disposed on the solid-state imaging device 20, a transparent substrate 40 fixed to the frame 30 so as to cover the solid-state imaging device 20 with an interval therebetween, and a sealing material 50 sealing the outside of the frame 30 and the transparent substrate 40 on the mounting substrate 10.

The mounting substrate 10 is a structural member that supports the solid-state imaging device 20. Therefore, the mounting substrate 10 is formed of a material having sufficient rigidity. The mounting substrate 10 may be a simple support having no components electrically incorporated in a circuit, but is preferably a circuit board in which a circuit for supplying power to the solid-state imaging device 20 and extracting a signal from the solid-state imaging device 20 is formed. In the present embodiment, the mounting substrate 10 is a circuit board in which a circuit including a terminal 11 is formed so as to be electrically connected to the solid-state imaging device 20.

Examples of the mounting substrate 10 include an organic substance such as polyimide, polyester, ceramic, epoxy, bismaleimide triazine resin, or phenol resin, a structure obtained by impregnating a paper, a glass fiber nonwoven fabric, or the like with the organic substance and curing by heating, alumina, aluminum nitride, beryllium oxide, or a ceramic such as silicon nitride, and a metal substrate. Among them, glass epoxy substrates, ceramic substrates, and bismaleimide triazine resin substrates are preferable. A circuit having a metal wiring pattern or a metal bump can be formed on the surface of or inside these insulating substrates.

The solid-state imaging device 20 includes a functional portion 21 for performing imaging, a margin portion 22 surrounding the functional portion 21, and a connection portion 23 provided further to the outer side of the margin portion 22. The solid-state imaging device 20 may be mounted on a side of the mounting substrate 10 opposite to the transparent substrate 40. As the functional section 21, for example, a two-dimensional imaging device structure such as a CMOS (complementary metal oxide semiconductor) image sensor can be formed. The margin portion 22 is a region for fixing the frame 30, and is not provided with components to be exposed. That is, there are no functional portions, connection terminals, or the like. The connection portion 23 is a region in which a terminal 231 for electrically connecting the solid-state imaging device 20 to the mounting substrate 10 or the like is disposed. In the present embodiment, the solid-state imaging device 20 and the mounting substrate 10 are electrically connected to each other by a wire 232.

The frame 30 is disposed on the margin portion 22 of the solid-state imaging device 20 so as to surround the functional portion 21. The frame 30, together with the transparent substrate 40, forms a sealed space for sealing the functional portion 21 on the solid-state imaging device 20. Further, the frame 30 is preferably formed of a resin composition containing a black pigment or a light diffusion material so that light can be prevented from entering the functional portion 21 from the lateral side. Further, the frame 30 is preferably formed in an inverse tapered shape in which the inner peripheral surface decreases in diameter toward the side of the transparent substrate 40 in order to suppress the reflection light on the inner peripheral surface incident on the functional portion 21, and may have a shape in which the reduction ratio in diameter of the inner peripheral surface becomes smaller on the side of the transparent substrate 40, for example, in a step shape or in a dome shape.

The lower limit of the surface roughness Ra of the inner peripheral surface of the frame 30 is preferably 50 nm, and more preferably 500 nm. On the other hand, the upper limit of the surface roughness Ra of the inner peripheral surface of the frame 30 is preferably 30 μm, and more preferably 5 μm. Thus, it is possible to reduce the light incident on the inner peripheral surface of the frame 30 from the slope direction and reaching the solid-state imaging device 20, and it is possible to suppress ghosting in the photographed image.

Figure 2:
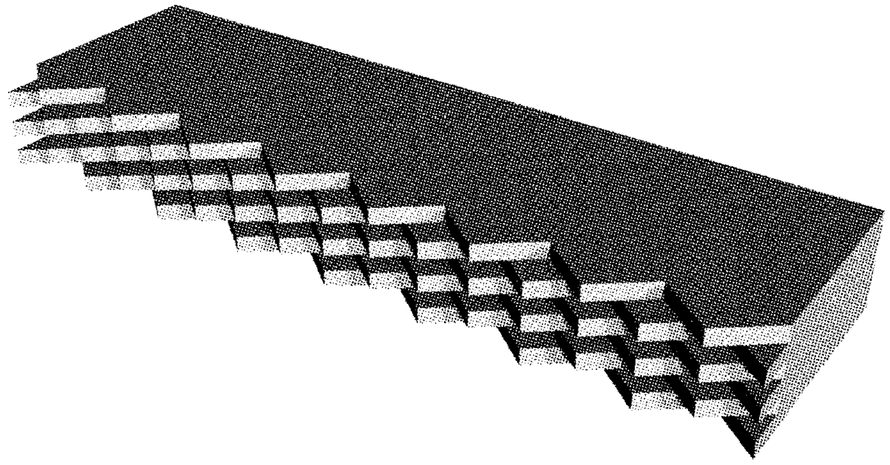
FIG. 2 is a partially enlarged perspective view showing a shape of an inner peripheral surface of a frame of the solid-state imaging device package of FIG. 1.

In order to realize such a surface roughness Ra, as shown in FIG. 2, the frame 30 may have, on the inner peripheral surface thereof, a plurality of wave shapes formed by repeating irregularities in a direction parallel to the solid-state imaging device 20 (the light receiving surface of the functional portion 21) and the transparent substrate 40, and by shifting and aligning the phase of each of the plurality of wave shapes in a direction perpendicular to the solid-state imaging device 20 and the transparent substrate 40. That is, a plurality of rows of protrusions arranged in a direction parallel to the solid-state imaging device 20 and the transparent substrate 40 may be formed on the inner peripheral surface of the frame 30. The wave shape is preferably formed without a gap over the entire inner peripheral surface of the frame 30. The wave shape is preferably formed at a constant pitch (wavelength). The waveform of the wave shape is not particularly limited, and may be a sine wave shape, a rectangular wave shape, a triangular wave shape, or the like (in FIG. 2, a triangular wave shape is used for easy understanding). In order to efficiently form fine irregularities, the phase difference of the adjacent wave shape is preferably set to about 180°.

The lower limit of the pitch of the wave-shape is preferably 50 nm, and more preferably 500 nm. On the other hand, the upper limit of the pitch of the wave-shape is preferably 30 μm, and more preferably 5 μm. The lower limit of the wave height of the wave shape is preferably 350 nm, and more preferably 500 nm. On the other hand, the upper limit of the wave height of the wave shape is preferably 30 μm, and more preferably 5 μm. The lower limit of the interval between the wave-shaped rows is preferably 0.1 μm, and more preferably 0.3 μm. On the other hand, the upper limit of the interval between the wave-shaped rows is preferably 10 μm, and more preferably 3 μm. By satisfying these conditions, it is possible to easily realize the above-described preferable surface roughness Ra.

The frame 30 is preferably formed of a photocurable resin for the purpose of the formation by a 3D printer as described later. The frame 30 may be bonded to the solid-state imaging device 20 and the transparent substrate 40 by an adhesive. However, in order to ensure the accuracy of the relative position, the frame 30 is preferably directly bonded to at least one of the mounting substrate 10 and the transparent substrate 40, and more preferably at least directly bonded to the transparent substrate 40.

The transparent substrate 40 allows light to enter the solid-state imaging device 20. The transparent substrate 40 may be made of a transparent ceramic such as glass or sapphire, or a transparent plastic such as an acrylic resin or polycarbonate, and is preferably made of a transparent ceramic from the viewpoint of reliability. From the viewpoint of versatility, glass is preferably used. The type of glass is not particularly limited, and examples thereof include quartz glass, borosilicate glass, and alkali-free glass. Although the transparent substrate 40 may be bonded to the frame 30 by an adhesive, it is preferable that the material of the frame 30 is directly laminated on one surface of the transparent substrate 40.

The sealing material 50 seals the outside of the solid-state imaging device 20, the frame 30, and the transparent substrate 40 on the mounting substrate 10, thereby preventing the frame 30 and the transparent substrate 40 from being separated from the solid-state imaging device 20 by an external object. Further, the sealing material 50 protects the wire 232 and secures electrical connection between the mounting substrate 10 and the solid-state imaging device 20.

As the sealing material 50, a thermosetting resin such as an epoxy resin, an acrylic resin, or a silicone resin is preferable, and an epoxy resin is particularly preferable from the viewpoint of toughness and heat resistance. Further, the sealing material 50 is preferably formed of a resin composition containing a black pigment or a light diffusion material so as to prevent unintended light entering the functional portion 21. Further, the sealing material 50 may contain a filler such as silica to have thixotropy before curing in order to facilitate formation.

Figure 3:
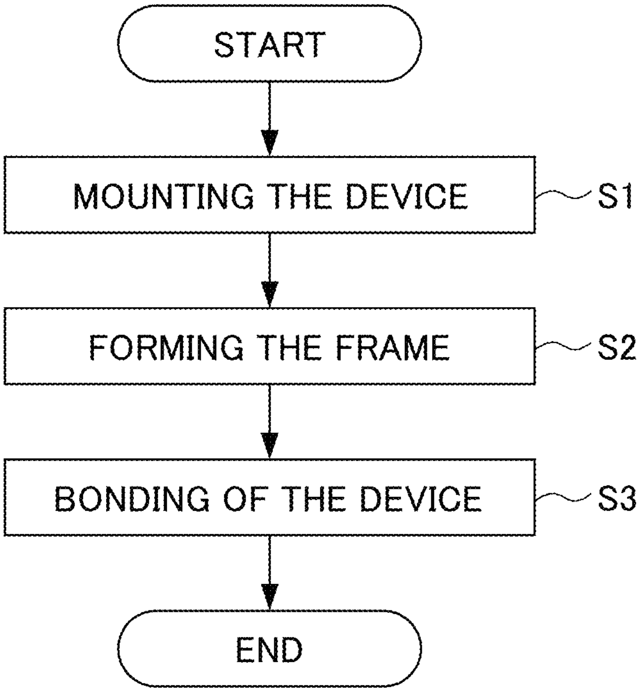
FIG. 3 is a flowchart showing the procedure of a solid-state imaging device package manufacturing method according to an embodiment of the present invention.

The solid-state imaging device package 1 described above can be manufactured by the solid-state imaging device package manufacturing method according to the embodiment of the present invention shown in FIG. 3. The solid-state imaging device package manufacturing method according to the present embodiment includes a step of mounting the solid-state imaging device 20 on the mounting substrate 10 (step S1: device mounting step), a step of forming the frame 30 on the transparent substrate 40 by a 3D printer (step S2: frame forming step), and a step of bonding the solid-state imaging device 20 mounted on the mounting substrate 10 to the frame 30 (step S3: device bonding step).

In the device mounting step of step S1, the solid-state imaging device 20 is mounted on the mounting substrate 10. The method of mounting the solid-state imaging device 20 is not particularly limited, and a well-known mounting technique such as flip chip bonding can be adopted in addition to wire bonding as shown in the figure.

In the frame forming step of step S2, the frame 30 is formed by laminating the resin in multiple layers on the transparent substrate 40 by a 3D printer. By using a 3D printer, it is possible to precisely form the frame 30 having a desired shape in a state in which the frame 30 is arranged without positional displacement with respect to the transparent substrate 40.

As the 3D printer forming the frame 30, an optical modeling 3D printer in which a step of obtaining a single-layer cured product by irradiating a desired region of a surface layer of a photocurable resin with laser light is repeated, an inkjet 3D printer in which a step of ejecting minute droplets of the photocurable resin to a desired region and irradiating the ejected photocurable resin with light to obtain a single-layer cured product is repeated, and the like are preferably used. By forming the frame 30 using a 3D printer, it is possible to reduce the risk of adhesion of resin or other foreign matter forming the frame 30 to other regions of the transparent substrate 40.

When the frame 30 is formed by an optical modeling 3D printer, the lower limit of the height of a single layer of the resin is preferably 0.1 μm, and more preferably 0.3 μm. On the other hand, the upper limit of the height of a single layer of the resin is preferably 10 μm, and more preferably 3 μm. This makes it possible to efficiently form the frame 30 having a desired shape.

In order to form a plurality of wave shapes for imparting a desired surface roughness Ra to the inner peripheral surface of the frame 30, it is preferable that the inner peripheral edge of the pattern of the resin to be laminated (the shape of the region irradiated with light) corresponding to the inner peripheral surface of the frame 30 is formed into a wave shape, and the resin is laminated by shifting the phase of the wave shape for each layer.

When the frame 30 is formed by an ink jet 3D printer, the lower limit of the volume of droplets ejected by the ink jet 3D printer is preferably 0.05 pL, and more preferably 0.50 pL. On the other hand, the upper limit of the volume of the droplets ejected by the ink jet 3D printer is preferably 3.0 pL, and more preferably 0.5 pL. With such a configuration, it is possible to form irregularities derived from droplets on the entire surface of the frame 30, and impart a preferable surface roughness Ra to the inner peripheral surface.

In the device bonding step of step S3, the solid-state imaging device 20 is bonded to the side opposite to the transparent substrate 40 of the frame 30. The frame 30 and the solid-state imaging device 20 may be bonded to each other using an adhesive. As the adhesive for bonding the frame 30 and the solid-state imaging device 20, for example, an epoxy adhesive, an acrylic adhesive, a urethane adhesive, or the like can be used.

In the solid-state imaging device package 1 manufactured by the above-described solid-state imaging device package manufacturing method, since an appropriate surface roughness is imparted to the inner peripheral surface of the frame 30, it is possible to prevent noise that deteriorates the imaging quality due to scattering of the light incident from the slope direction and the resulting reflected light incident onto the solid-state imaging device 20. In particular, in the solid-state imaging device package 1 adopting the GoC structure for size reduction, a high-quality image can be photographed by accurately forming the frame 30 having appropriate irregularities on the inner peripheral surface by a 3D printer.

Figure 4:
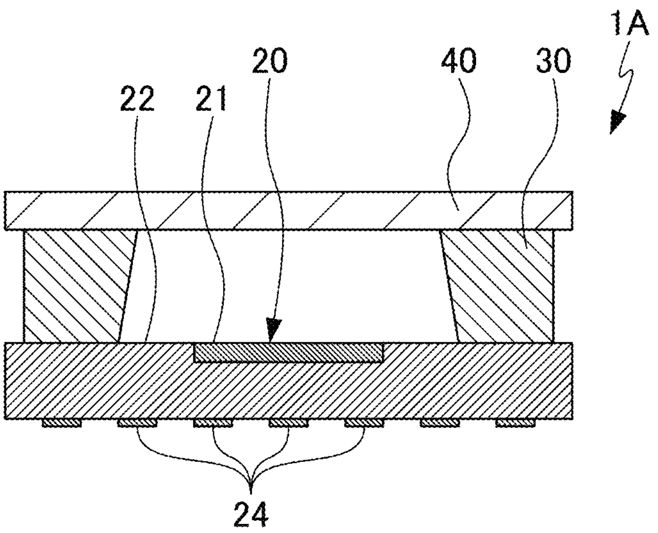
FIG. 4 is a cross-sectional view of a solid-state imaging device package according to an embodiment different from FIG. 1 of the present invention.

Next, another embodiment of the present invention will be described. FIG. 4 is a cross-sectional view of a solid-state imaging device package 1A according to a second embodiment of the present invention. The solid-state imaging device package 1A is a so-called CSP (Chip Size Package) type solid-state imaging device. In the description of the solid-state imaging device package 1A of the present embodiment, components similar to those of the solid-state imaging device package 1 of FIG. 1 are denoted by the same reference numerals, and otherwise redundant descriptions thereof may be omitted.

The solid-state imaging device package 1A includes a solid-state imaging device 20A, the frame 30 disposed on the solid-state imaging device 20A, and the transparent substrate 40 fixed to the frame 30 so as to cover the solid-state imaging device 20A with an interval therebetween.

The solid-state imaging device 20A includes the functional portion 21 for performing imaging and the margin portion 22 surrounding the functional portion 21 on the front side (the side opposite to the transparent substrate), and includes a plurality of pad electrodes 24 on the back side. The functional portion 21 and the pad electrodes 24 may be connected by a wiring pattern disposed so as to pass through the margin portion 22 and go around the end face of the solid-state imaging device 20A.

Figure 5:
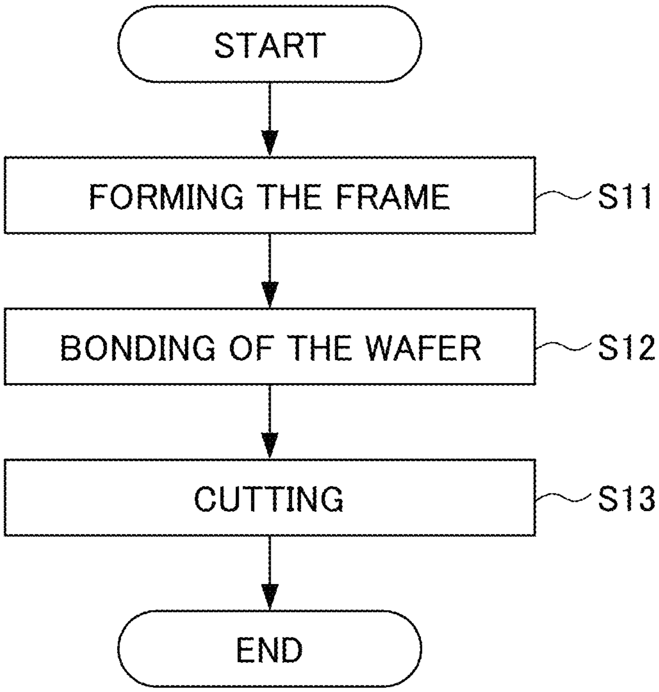
FIG. 5 is a flowchart showing the procedure of a solid-state imaging device package manufacturing method according to an embodiment different from FIG. 3 of the present invention.

The solid-state imaging device package 1A can be manufactured by a solid-state imaging device package manufacturing method according to another embodiment of the present invention shown in FIG. 5. Specifically, the solid-state imaging device package 1A can be manufactured by a solid-state imaging device package manufacturing method including a step of forming the frame 30 having a predetermined surface roughness Ra on its inner peripheral surface on a large-sized transparent substrate base material before being cut into a plurality of transparent substrates 40 by a 3D printer (step S11: frame forming step), a step of bonding the transparent substrate base material with a semiconductor wafer before dicing in which structures of a plurality of solid-state imaging devices 20A are formed so as to bond each solid-state imaging device 20A to a corresponding frame 30 (step S12: wafer bonding step), and a step of simultaneously cutting the semiconductor wafer and the transparent substrate base material, thereby cutting them into a plurality of solid-state imaging device packages 1A (step S13: cutting step).

Also in the solid-state imaging device package 1A adopting the CSP structure capable of particularly reducing the projected area, a high-quality image can be photographed by accurately forming the frame 30 having appropriate irregularities on the inner peripheral surface by a 3D printer.

Although embodiments of the present invention have been described above, the present invention is not limited to the embodiments described above, and various changes and modifications are possible. In the solid-state imaging device package manufacturing method according to the present invention, a frame may be formed on one of the solid-state imaging device and the transparent substrate, the other may be bonded to the frame, the frame may be formed for the solid-state imaging device by a 3D printer, and the frame thus formed may be bonded to the transparent substrate. In the solid-state imaging device package according to the present invention, the mounting substrate and the sealing material have arbitrary configurations.

EXAMPLES

In the following, the present invention will be specifically explained based on Examples. However, the present invention is not limited to the following examples.

<Photosensitive Resin Composition>

As a material for forming the frame, a photosensitive resin composition was prepared in which 15 parts by weight of an alicyclic epoxy compound “Ceroxide 2021P” manufactured by Daicel Corporation, 3 parts by weight of a photocationic polymerization initiator “CPI-210S” manufactured by San-Apro Ltd., and 0.1 parts by weight of an antioxidant “IRGANOX1010” manufactured by BASF were mixed with 100 parts by weight of a main polymer having a cyclic polysiloxane structure in the main chain and having a cationic polymerizable group and an alkali-soluble group.

The main polymer was prepared by the following procedure. First, to a mixture of 40 g of diallyl isocyanurate, 29 g of diallyl monomethyl isocyanurate and 264 g of 1,4-dioxane, 124 mg of a platinum vinylsiloxane complex xylene solution “Pt-VTSC-3X” manufactured by Umicore Precision Metals Japan was added to obtain solution S1. Further, 88 g of 1,3,5,7-tetrahydrogen-1,3,5,7-tetramethylcyclotetrasiloxane was dissolved in 176 g of toluene to obtain solution S2. Then, under a nitrogen atmosphere containing 3% by volume of oxygen, the solution S1 was added by dropping into the solution S2 over 3 hours in a state in which the solution S2 was heated to a temperature of 105° C., and after completion of the addition by dropping, the resultant solution was stirred for 30 minutes while maintaining the temperature at 105° C. to obtain solution S3. When the reaction rate of the alkenyl group of the compound contained in the obtained solution S3 was measured by 1H-NMR, the reaction rate was 95% or more. Further, 62 g of 1-vinyl-3,4-epoxycyclohexane was dissolved in 62 g of toluene to obtain solution S4. Then, the solution S4 was added by dropping into the solution S3 over 1 hour in a state in which the solution S3 was heated to a temperature of 105° C. in a nitrogen atmosphere containing 3% by volume of oxygen, and after completion of the dropping, the resultant solution was stirred for 30 minutes while maintaining the temperature at 105° C. to obtain solution S5. When the reaction rate of the alkenyl group of the compound contained in the obtained solution S5 was measured by 1H-NMR, the reaction rate was 95% or more. Then, after cooling the solution S5, the solvent (toluene, xylene, and 1,4-dioxane) was evaporated from the solution S5 under reduced pressure to obtain a main polymer. The main polymer had a plurality of cationic polymerizable groups and a plurality of alkali-soluble groups in one molecule and a cyclic polysiloxane structure in the main chain.

<Trial of Solid-State Imaging Device Package>

Using an ink jet 3D printer, an optical modeling 3D printer, or a dispenser, a frame was formed on a transparent substrate or a mounting substrate using the photosensitive resin composition under different conditions, and a solid-state imaging device package was produced by trial.

Example 1

On a transparent substrate (10 cm×10 cm, thickness 0.4 mm), a plurality of frames having a rectangular cylindrical structure having a line width of 200 μm and a thickness of 50 μm were formed using an ink jet 3D printer. At this time, the droplet volume of the ink jet used was 15 pL. At this time, the layers were laminated in a semi-cured state by exposing ultraviolet light each time one layer was applied. The angle (hereinafter referred to as “taper angle”) between the inner peripheral surface of the frame and the inner transparent substrate was 90°. Next, a dicing film was temporarily bonded to the surface of the transparent substrate on which the frame was not provided, and then the transparent substrate was cut by a dicing blade, and the dicing film was peeled off to obtain an individualized transparent substrate with a frame. Next, the obtained individualized transparent substrate with a frame and the mounting substrate on which the solid-state imaging device was mounted were laminated, and the solid-state imaging device and the frame were thermocompression bonded by applying a load of 500 g on a hot plate at a temperature of 120° C. for 30 seconds to obtain Example 1 of the solid-state imaging device package. As the mounting substrate, a wiring substrate which provides wiring for connecting the solid-state imaging device to the outside was used. After the solid-state imaging device and the frame were bonded to each other, a sealing resin was applied to the outer peripheral portion of the mounting substrate to seal the outer peripheral portions of the solid-state imaging device, the frame, and the transparent substrate.

Examples 2 to 8

Solid-state imaging device packages of Examples 2 to 6 were obtained in the same manner as in Example 1 except that the ink jet droplets were changed to 1.0 pL, 2.0 pL, 0.5 pL, 0.1 pL, and 5.0 pL, respectively. Solid-state imaging device packages of Examples 6 to 8 were obtained in the same manner as in Trial Example 1 except that the droplet sizes were set to 1.0 pL and 2.0 pL, and the taper angle was set to 120°.

Comparative Examples 1 and 2

Solid-state imaging device packages of Comparative Examples 1 and 2 were obtained in the same manner as in Example 1 except that the taper angles were changed to 70° and 120°, respectively.

Example 9

A photosensitive resin composition having a thickness of 1 μm per layer was laminated on a transparent substrate in multiple layers using an optical modeling 3D printer to form a plurality of frames having a thickness of 50 μm. At this time, the inner peripheral edge of the frame was formed into a wave shape with a pitch of 1 μm shifted by half pitch for each layer. Thereafter, a solid-state imaging device package of Example 9 was obtained in the same manner as in Example 1.

Examples 10 to 17

Solid-state imaging device packages of Examples 10 to 13 were obtained in the same manner as in Example 9, except that the pitch of the wave shape was changed to 2 μm, 5 μm, 10 μm, and 15 μm. Solid-state imaging device packages of Examples 14 to 17 were obtained in the same manner as in Example 13 except that the taper angles were changed to 70°, 80°, 110°, and 120°, respectively.

Comparative Example 3

A solid-state imaging device package of Comparative Example 3 was obtained in the same manner as in Example 9 except that the pitch of the wave shape was changed to 50 μm.

Comparative Example 4

A frame was formed by applying, by a dispenser, a photosensitive resin composition to a margin portion of a solid-state imaging device so as to have a line width of 200 μm and a thickness of 50 μm, a transparent substrate was placed on the frame, and the frame was temporarily fixed by exposing the frame to 1500 mJ/cm$^2$ using a high-pressure mercury lamp manual exposure machine "MA-1300" manufactured by Japan Science Engineering Co., Ltd., and further, the frame was cured by heating in an oven at a temperature of 200° C. for 2 hours. Next, the peripheral portion of the frame was sealed with a sealing resin to obtain a solid-state imaging device package of Comparative Example 4 (conventional example).

<Evaluation of Solid-State Imaging Device Package>

[Surface Roughness Ra]

The arithmetic average roughness Ra (evaluation length: 20 μm) of the frame inner peripheral surface of each example and each comparative example of the solid-state imaging device package was measured using a 3D measuring laser microscope ("LEXT (registered trademark) OLS5100" manufactured by Olympus Corporation).

[Ghost Index]

With regard to the imaging performance of each example and each comparative example of the solid-state imaging device package, using a ghost flare evaluation system "GCS-2T" manufactured by Tsubosaka Electric Co., Ltd., an abnormal pixel number ratio (abnormal pixel number/total pixel number) obtained by dividing the abnormal pixel number which is the number of pixels exceeding one of 100 million with respect to the brightness of the light source by the total number of pixels was calculated, and the ghost index obtained by normalizing the abnormal pixel number ratio of the Examples 1 to 17 and Comparative Examples 1 to 3 was calculated by setting the abnormal pixel number ratio of Comparative Example 4 which is the conventional example as 100%. It is evaluated that the performance capable of suppressing ghost generation is higher as the ghost index is smaller.

[Lamination Yield]

For each example and each comparative example of the solid-state imaging device package, the state of adhesion to the frame was observed through the transparent substrate using an optical microscope. One hundred pieces of solid-state imaging device packages were observed, and the pieces in which peeling or voids occurred were defined as NG, "A" was defined when the occurrence rate of NG was less than 3%, "B" was defined when the occurrence rate of NG was greater than or equal to 3% and less than 5%, "C" was defined when the occurrence rate of NG was greater than or equal to 5% and less than 10%, and "D" was defined when the occurrence rate of NG was greater than or equal to 10%.

[Thermal Shock Test]

For each example and each comparative example of the solid-state imaging device package, a heat shock test apparatus ("Cosmopia (registered trademark) S" manufactured by JOHNSON CONTROLS-HITACHI AIR CONDITIONING) was used to carry out 500 cycles of holding in an atmosphere of −50° C. for 30 minutes, and then holding in an atmosphere of 125° C. for 30 minutes as one cycle, and then the frame was observed through a transparent substrate using an optical microscope, and the number of cracked portions of the frame and the number of peeled off portions of the frame were counted. A case where the total number of crack portions and peeled off portions of the frame is 1 or less was defined as "A," a case where the total number of crack portions and peeled off portions of the frame is 2 or more and 9 or less was defined as "B," and a case where the total number of crack portions and peeled off portions of the frame is 10 or more was defined as "C."

For each example and each comparative example of the solid-state imaging device package, the droplet size of the ink jet 3D printer or the pitch of the wave-shape of the optical modeling 3D printer, the surface roughness Ra of the inner peripheral surface of the frame, the ghost index, the lamination yield, and the thermal shock resistance are summarized in the following Table 1. It should be noted that "-" in the table indicates that a corresponding value cannot be assumed.

TABLE 1

| Trial Number | Droplet Size [pL] | Wave Shape Pitch [μm] | Taper Angle [°] | Surface Roughness Ra [μm] | Ghost Index [%] | Lamination Yield | Thermal Shock Resistance |
|---|---|---|---|---|---|---|---|
| Example 1 | 1.5 | — | 90 | 15 | 80 | B | B |
| Example 2 | 1.0 | — | 90 | 10 | 77 | B | B |
| Example 3 | 2.0 | — | 90 | 20 | 88 | B | B |
| Example 4 | 0.5 | — | 90 | 5 | 73 | B | B |
| Example 5 | 0.1 | — | 90 | 1 | 72 | B | B |
| Example 6 | 1.5 | — | 120 | 15 | 77 | B | B |
| Example 7 | 1.0 | — | 120 | 10 | 70 | B | B |
| Example 8 | 0.5 | — | 120 | 5 | 63 | B | B |
| Comparative Example 1 | 5.0 | — | 90 | 50 | 96 | D | C |
| Comparative Example 2 | 1.5 | — | 70 | 15 | 88 | B | B |
| Example 9 | — | 1 | 90 | 1.5 | 72 | A | A |
| Example 10 | — | 2 | 90 | 2.7 | 72 | A | A |
| Example 11 | — | 5 | 90 | 6 | 75 | A | A |
| Example 12 | — | 10 | 90 | 12 | 77 | A | A |
| Example 13 | — | 15 | 90 | 17 | 81 | A | A |
| Example 14 | — | 15 | 70 | 17 | 89 | A | A |
| Example 15 | — | 15 | 80 | 17 | 85 | A | A |

TABLE 1-continued

| Trial Number | Droplet Size [pL] | Wave Shape Pitch [μm] | Taper Angle [°] | Surface Roughness Ra [μm] | Ghost Index [%] | Lamination Yield | Thermal Shock Resistance |
|---|---|---|---|---|---|---|---|
| Example 16 | — | 15 | 110 | 17 | 79 | A | A |
| Example 17 | — | 15 | 120 | 17 | 78 | A | A |
| Comparative Example 3 | — | 50 | 90 | 52 | 97 | A | A |
| Comparative Example 4 | — | — | 90 | 0.1 | 100 | A | C |

As described above, it was confirmed that, by using a 3D printer and adjusting the droplet size or the wave pitch, an appropriate surface roughness Ra was imparted to the inner peripheral surface of the frame, and the ghost index can be reduced while maintaining the lamination yield and the thermal shock resistance. It was also confirmed that, by increasing the taper angle, the ghost index can be further reduced while maintaining the lamination yield and the thermal shock resistance.

EXPLANATION OF REFERENCE CHARACTERS

1 solid-state imaging device package
10 mounting substrate
20 solid-state imaging device
21 functional unit
22 margin portion
23 connection portion
30 frame
40 transparent substrate
50 sealing material

What is claimed is:

1. A solid-state imaging device package manufacturing method, the solid-state imaging device package comprising a solid-state imaging device including a functional portion that performs imaging and a margin portion that surrounds the functional portion, a frame provided on the margin portion, and a transparent substrate that is opposite to the functional portion and fixed to the frame to cover the functional portion, the manufacturing method comprising the steps of:

forming the frame by laminating a resin in multiple layers by a three-dimensional (3D) printer on either one of the solid-state imaging device or the transparent substrate; and bonding one other of the solid-state imaging device or the transparent substrate to the frame, wherein the step of forming the frame further includes laminating the resin so that a surface roughness Ra of an inner peripheral surface of the frame is 50 nm or more and 30 μm or less.

2. The solid-state imaging device package manufacturing method according to claim 1, wherein the 3D printer is an optical modeling 3D printer, and a height of a single layer is set to 0.1 μm or more and 10 μm or less.

3. The solid-state imaging device package manufacturing method according to claim 2, wherein an inner peripheral edge of a pattern of the resin to be laminated corresponding to the inner peripheral surface of the frame is formed into a wave shape, and the resin is laminated to shift a phase of the wave shape for each layer.

4. The solid-state imaging device package manufacturing method according to claim 3, wherein a pitch of the wave shape is 50 nm or more and 30 μm or less, and a wave height of the wave shape is 50 nm or more and 30 μm or less.

5. The solid-state imaging device package manufacturing method according to claim 1, wherein the 3D printer is an ink jet 3D printer that ejects a droplet of the resin having a volume of 0.05 pL or more and 3.0 pL or less.

6. A solid-state imaging device package comprising:

a solid-state imaging device including a functional portion that performs imaging and a margin portion that surrounds the functional portion;

a frame provided on the margin portion; and a transparent substrate that is fixed to the frame to cover the functional portion, wherein a surface roughness Ra of an inner peripheral surface of the frame is 50 nm or more and 30 μm or less.

7. The solid-state imaging device package according to claim 6, wherein the frame has, on the inner peripheral surface, a plurality of wave shapes formed by repeating irregularities in a direction parallel to the solid-state imaging device and the transparent substrate, and by shifting a phase of each of the plurality of wave shapes in a direction perpendicular to the solid-state imaging device and the transparent substrate.

* * * * *